(12) United States Patent
Morita et al.

(10) Patent No.: US 9,584,002 B2
(45) Date of Patent: Feb. 28, 2017

(54) GENERATOR INCLUDING A SLIDING MEMBER MADE OF A BIOMASS-CONTAINING MATERIAL

(71) Applicant: Sony Corporation, Tokyo (JP)

(72) Inventors: Yuko Morita, Kanagawa (JP); Masakazu Yajima, Chiba (JP); Hideo Niikura, Tokyo (JP); Yohei Fukuma, Chiba (JP)

(73) Assignee: Sony Corporation, Tokyo (JP)

( * ) Notice: Subject to any disclaimer, the term of this patent is extended or adjusted under 35 U.S.C. 154(b) by 297 days.

(21) Appl. No.: 13/946,098

(22) Filed: Jul. 19, 2013

(65) Prior Publication Data

US 2014/0028151 A1 Jan. 30, 2014

(30) Foreign Application Priority Data

Jul. 27, 2012 (JP) .................................. 2012-167649

(51) Int. Cl.
| | |
|---|---|
| *H02K 35/00* | (2006.01) |
| *F16C 33/20* | (2006.01) |
| *H02K 35/04* | (2006.01) |
| *H01L 41/113* | (2006.01) |
| *H01L 41/12* | (2006.01) |
| *H02N 1/04* | (2006.01) |

(52) U.S. Cl.
CPC .............. *H02K 35/00* (2013.01); *F16C 33/201* (2013.01); *H01L 41/113* (2013.01); *H01L 41/125* (2013.01); *H02K 35/04* (2013.01); *H02N 1/04* (2013.01); *F16C 2202/00* (2013.01)

(58) Field of Classification Search
CPC ............................................ H02K 35/00–35/06
USPC ................................................ 310/15–36, 334
See application file for complete search history.

(56) References Cited

U.S. PATENT DOCUMENTS

| | | | |
|---|---|---|---|
| 6,310,171 B1 * | 10/2001 | Naito et al. .................... 528/49 |
| 6,673,463 B1 * | 1/2004 | Onishi et al. .................. 428/480 |
| 7,199,480 B2 * | 4/2007 | Fripp et al. .................... 290/1 R |
| 7,329,972 B2 * | 2/2008 | Ito ............................... 310/12.01 |
| 2003/0234585 A1 * | 12/2003 | Tu ............................ H01F 7/021 |
| | | | 310/12.12 |
| 2008/0265692 A1 * | 10/2008 | Roberts ............................. 310/15 |
| 2008/0296984 A1 * | 12/2008 | Honma et al. .................... 310/17 |
| 2009/0003898 A1 * | 1/2009 | Kayahara et al. ............. 399/327 |
| 2010/0117607 A1 * | 5/2010 | Mochida .............. H02K 7/1876 |
| | | | 322/99 |
| 2010/0194117 A1 * | 8/2010 | Pabon ................... H02K 35/02 |
| | | | 290/1 R |
| 2013/0140919 A1 * | 6/2013 | Ueno et al. ..................... 310/26 |

FOREIGN PATENT DOCUMENTS

| | | | | |
|---|---|---|---|---|
| JP | 2012-080604 A | | 4/2012 | |
| TW | EP 2343792 A1 * | | 7/2011 | .............. B62J 6/003 |

* cited by examiner

*Primary Examiner* — Thomas Truong
(74) *Attorney, Agent, or Firm* — Sheridan Ross P.C.

(57) ABSTRACT

A generator includes a sliding member, a first power generation element and a second power generation element. The sliding member is made of a biomass-containing material. The first power generation element is configured to slide with respect to the sliding member. The second power generation element is configured to generate electrical power by variation of its relative position with respect to the first power generation element.

12 Claims, 11 Drawing Sheets

| Samples | Composition | Static friction coefficient | Kinetic friction coefficient |
|---|---|---|---|
| Material A: CA11-049 | PMMA/PLA | 0.16 | 0.16 |
| Material B: XE4010 | PA series | 0.19 | 0.17 |
| Material C: G830 | PA series | 0.17 | 0.17 |
| Material D: VH001 | PMMA | 0.23 | 0.20 |

FIG.3

| | Ecodear CA11-049 containing PLA series (Material A) | Grilamid XE 4010 containing PA series (Material B) | Rilsan Clear G830 containing PA series (Material C) |
|---|---|---|---|
| Manufacturer | Toray | EMS-Chemie | Arkema |
| Ratio of plants | 25% (derived from starch) | 58% (derived from castor oil) | 54% (derived from castor oil) |
| Density | 1.21g/cm$^3$ | 1.05g/cm$^3$ | 1.01g/cm$^3$ |
| Flexural Strength | 120MPa | - | - |
| Flexural modulus | 3700MPa | - | 1510MPa |
| Tensile modulus | - | 1700MPa | 1590MPa |
| Tensile modulus strength at break | 90MPa | 60MPa | 57MPa |
| Heat deflection temperature (0.45MPa) | 75°C | 100°C | 117°C |
| Charpy impact strength | 2kJ/m$^2$ | 9kJ/m$^2$ | 10kJ/m$^2$ |
| Flame resistance (UL94) | HB | HB | HB |
| Biodegradability | Biodegradable | Not biodegradable | Not biodegradable |

FIG.4

| Sample name | Sample mass change | | |
|---|---|---|---|
| | Before test (g) | After test (g) | Wear mass (mg) |
| Material A: CA11-049 | 3.35726 | 3.20313 | 154.1 |
| Material B: XE4010 | 2.77969 | 2.72409 | 55.6 |
| Material C: G830 | 2.72209 | 2.64124 | 80.8 |
| Material D: VH001 | 3.35164 | 3.03977 | 311.9 |

FIG.5

| Sample name | Kinetic friction coefficient $\mu$ | | |
|---|---|---|---|
| | After 5-minute | After 60-minute | After 100-minute |
| Material A: CA11-049 | 0.36 | 0.33 | 0.38 |
| Material B: XE4010 | 0.47 | 0.43 | 0.44 |
| Material C: G830 | 0.47 | 0.43 | 0.43 |
| Material D: VH001 | 0.40 | 0.47 | 0.47 |

FIG.6

GENERATOR INCLUDING A SLIDING MEMBER MADE OF A BIOMASS-CONTAINING MATERIAL

BACKGROUND

The present disclosure relates to a generator configured to generate electrical power from variation of the relative position of a power generation element.

In generators configured to generate electrical power from relative movement of power generation elements, there are one which utilizes electromagnetic induction produced by relative movement of a coil and a magnetic substance, one which utilizes electrostatic induction produced by relative movement of a dielectric substance and a dielectric circuit, and the like. For example, Japanese Patent Application Laid-open No. 2012-80604 (hereinafter referred to as Patent Document 1) discloses a vibration-powered generator including a permanent magnet which moves within a tubular member, and a coil which is fixed outside the tubular member. This vibration-powered generator is one which generates electrical power from electromagnetic induction by that the permanent magnet relatively moves with respect to the coil when vibration is applied to it.

SUMMARY

In such generators as described above which utilize the relative movement of the power generation elements, those in which the frictional resistance of a movable element (as the permanent magnet described in Patent Document 1) is small are favorable. This is because when the frictional resistance is large, the movement velocity of the movable element is reduced and power generation amount decreases.

In addition, in the vibration-powered generator according to Patent Document 1, and in other various generators, materials that are not environmental friendly material have been utilized from the viewpoint of strength and cost. However, when using such materials, in terms of life cycle assessment (LCA), it is necessary that the energy required for producing the generator should be subtracted from the energy produced by the generator.

In view of the above-mentioned circumstances, it is desirable to provide a generator excellent in power generation efficiency.

According to an embodiment of the present disclosure, there is provided a generator including a sliding member, a first power generation element and a second power generation element.

The sliding member is made of a biomass-containing material.

The first power generation element is configured to slide with respect to the sliding member.

The second power generation element is configured to generate electrical power by variation of its relative position with respect to the first power generation element.

Herein, the term "biomass" means a useful substance (biological resource) obtained by utilizing organisms, and is a concept that also includes plant-derived materials. In addition, the term "biomass-containing material" means a material including biomass as a raw material. This can be any material as long as it contains biomass as a raw material, and the magnitude of the content ratio of biomass with respect to the entire biomass-containing material does not matter. With the above configuration, by employing the biomass-containing material to make the sliding member, the friction coefficient of the sliding member can be reduced, and the sliding ability of the first power generation element with respect to the sliding member is improved. As a result, power generation efficiency in generating electrical power from variation of the relative position of the first power generation element and the second power generation element is able to be improved. Further, by employing the sliding member made of the biomass-containing material, the amount of energy required for producing the generator is able to be reduced.

The second power generation element may be configured to slide with respect to the sliding member.

With this configuration, since the second power generation element in addition to the first power generation element slides with respect to the sliding member, the improvement of the sliding ability obtained by employing the sliding member made of the biomass-containing material is able to further contribute to the improvement of the power generation efficiency.

The biomass-containing material may include a mixed resin of polymethyl methacrylate and polylactic acid.

Since the mixed resin of polymethyl methacrylate and polylactic acid has small friction coefficient and has transparency, it is favorable as the biomass-containing material to be utilized to make the sliding member in a generator in which visibility of the inside is demanded.

The biomass-containing material may include a polyamide resin derived from castor oil.

Since the polyamide resin derived from castor oil has small friction coefficient, high durability, and sufficient waterproof and antifouling properties, it is favorable as the biomass-containing material to be utilized to make the sliding member in a generator in which durability is demanded.

The biomass-containing material may include a polylactic acid resin derived from starch.

Since the polylactic acid resin derived from starch has small friction coefficient and has biodegradability, it is favorable as the biomass-containing material to be utilized to make the sliding member in a generator in which biodegradability is demanded.

The first power generation element may be a magnet, and the second power generation element may be a coil.

With this configuration, power generation is made by electromagnetic induction caused by varying of the relative position of the magnet and the coil.

The first power generation element may be a dielectric substance including an electret, and the second power generation element may be an inductive circuit.

With this configuration, power generation is made by electrostatic induction caused by varying of the relative position of the dielectric substance and the inductive circuit.

The first power generation element may be a piezoelectric element, and the second power generation element may be a structure body configured to add stress to the piezoelectric element.

With this configuration, power generation is made by varying of the relative position of the piezoelectric element and the structure body. In this regard, this is a similar embodiment to the case of electrostatic induction or electromagnetic induction, but in the case of the piezoelectric element, the structure body which makes a pair with it is not non-contact.

The first power generation element may be an inverse magnetostrictive element, and the second power generation element may be a structure body configured to add stress to the inverse magnetostrictive element.

With this configuration, power generation is made by varying of the relative position of the inverse magnetostrictive element and the structure body. In this regard, this is a similar embodiment to the case of electrostatic induction or electromagnetic induction, but in the case of the inverse magnetostrictive element, the structure body which makes a pair with it is not non-contact.

The generator may further include a casing made of a biomass-containing material, which is configured to accommodate the sliding member, the first power generation element and the second power generation element; and a fixing member made of a biomass-containing material, which is configured to fix the sliding member to the casing.

With this configuration, a majority of the parts of the generator can be made of the biomass-containing material, and the amount of energy required for producing the generator is able to be reduced.

The first power generation element may be a rotating body configured to slide with respect to the sliding member, and the second power generation element may be a structure body provided around the rotating body.

With this configuration, the sliding ability of the rotating body, with respect to the sliding member, can be improved by employing the sliding member made of the biomass-containing material. As a result, generation efficiency in generating electrical power from variation of the relative position of the rotating body and the structure body by rotation of the rotating body is able to be improved.

The rotating body may be made of a biomass-containing material.

With this configuration, by employing the rotating body made of the biomass-containing material in addition to the sliding member made of the biomass-containing material, the amount of energy required for producing the generator is able to be reduced.

As described above, according to the present disclosure, it is able to provide a generator excellent in power generation efficiency.

These and other objects, features and advantages of the present disclosure will become more apparent in light of the following detailed description of best mode embodiments thereof, as illustrated in the accompanying drawings.

BRIEF DESCRIPTION OF DRAWINGS

FIG. 3 is a table showing measurement results of the friction coefficient of biomass-containing materials to be utilized as a sliding member of the generator and a comparative material;

FIG. 4 is a table showing physical property values of the biomass-containing materials to be utilized as the sliding member of the generator;

FIG. 5 is a measurement result for friction of the biomass-containing materials to be utilized as the sliding member of the generator and the comparative material;

FIG. 6 is a measurement result for friction of the biomass-containing materials to be utilized as the sliding member of the generator and the comparative material;

DETAILED DESCRIPTION OF EMBODIMENTS

First Embodiment

A generator according to a first embodiment of the present disclosure will be described.

[Overall Configuration of Generator]

Figure 1:
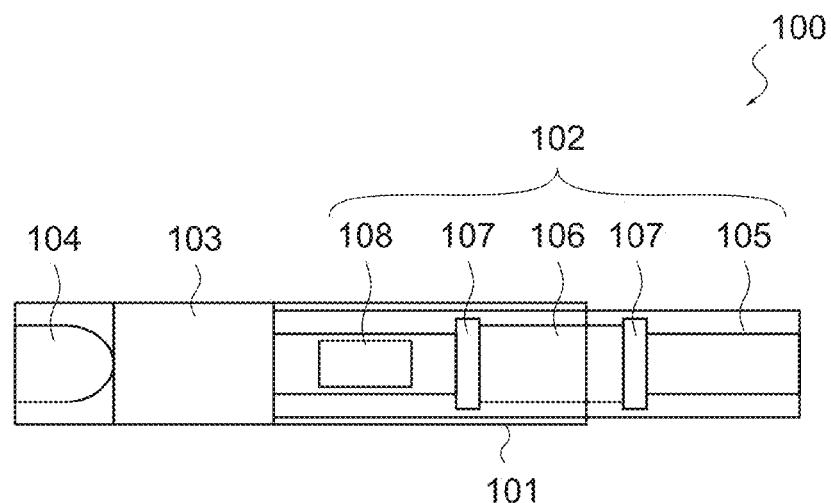
FIG. 1 is a schematic diagram showing a generator according to a first embodiment of the present disclosure.

FIG. 1 is a schematic diagram showing a generator 100 according to this embodiment. The generator 100 will be illustrated as a generator to be used as a teaching tool for learning the principles of power generation, but generators according to the present disclosure is not limited to such use.

As shown in FIG. 1, the generator 100 includes a casing 101, a power generation section 102, a circuit board 103 and a light emitting section 104.

The power generation section 102, the circuit board 103 and the light emitting section 104 are accommodated inside the casing 101.

The casing 101 is a member to accommodate each of the above components, and is favorable to be one made of a transparent material so that the inside is visible. The casing 101 can be a hollow cylindrical member, but is not limited to such a shape. The casing 101 can be made of a biomass-containing material which will be described later, and thus, energy required for producing the generator 100 can be reduced.

The power generation section 102 generates electrical power, and supplies the generated power to the circuit board 103. The detailed structure of the power generation section 102 will be described later. The power generation section 102 can be one which generates electrical power when vibration is applied to the generator 100 or when the generator 100 is tilted from the horizontal plane.

The circuit board 103 includes a rectifier circuit and a storage element. The circuit board 103 supplies the power supplied from the power generation section 102 to the light emitting section 104. The configuration and the arrangement of the circuit board 103 are not particularly limited.

The light emitting section 104 includes a light bulb, LED (Light Emitting Diode), or the like, and emits light upon receiving the power supplied from the circuit board 103. A mechanism (such as a motor) which enables checking that the power generation is made by the generator 100 may be provided in place of the light emitting section 104.

[Configuration of Power Generation Section]

Figure 2A:
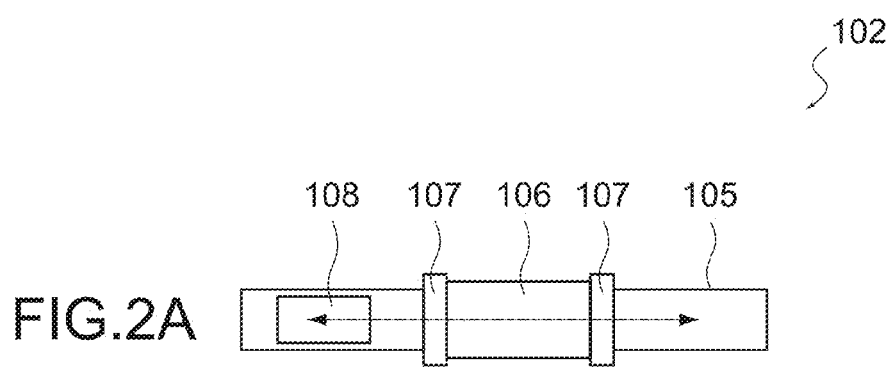
FIGS. 2A and 2B are schematic diagrams showing a power generation section of the generator.
Figure 2B:
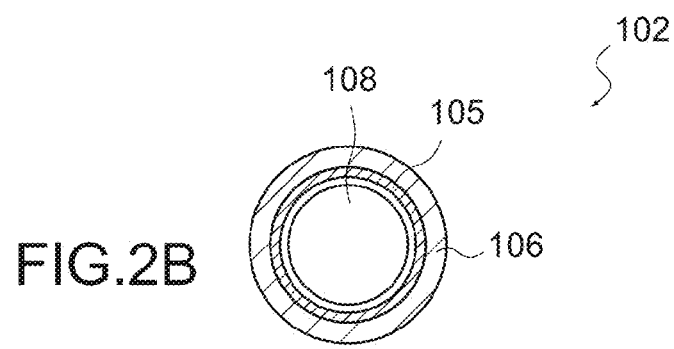

FIGS. 2A and 2B are schematic diagrams showing a configuration of the power generation section 102. FIG. 2A is a plan view of the power generation section 102, and FIG. 2B is a cross-sectional view of the power generation section 102. As shown in these figures, the power generation section 102 includes a sliding member 105, a coil 106, coil stoppers 107 and a magnet 108. The sliding member 105 is fixed to the casing 101 via the coil stopper 107. The coil 106 is wound around the sliding member 105, and is fixed to the sliding member 105 by the coil stoppers 107. The magnet 108 is accommodated inside the sliding member 105.

The sliding member 105 is a member to enable sliding of the magnet 108 with respect to the sliding member 105. Specifically, the sliding member 105 has a cylindrical shape and is configured to accommodate the magnet 108 in its interior. The sliding member 105 is not limited to cylindrical shape, and may be any shape that enables sliding of the magnet 108. The sliding member 105 can be made of a biomass-containing material which will be described later. By employing the sliding member 105 made of the biomass-containing material, it can reduce energy required for producing the generator 100.

The coil 106 causes electromagnetic induction between the coil 106 and the magnet 108. The coil can be made up from a conductive wire wound around outside of the sliding member 105, and both ends thereof are connected to the circuit board 103 (not shown). The number of winding and width of winding of the coil 106 can be adjusted as appropriate.

The coil stoppers 107 are disposed one by one at both ends of the coil 106. The coil stoppers 107 prevent the movement of the coil, and fix the coil 106 to the sliding member 105. In addition, the coil stopper 107 is in contact with the inner wall of the casing 101 to fix the sliding member 105 to the casing 101. The coil stopper 107 can be made of an elastic material, which may fix the sliding member 105 to the casing 101 by its elasticity. The coil stoppers 107 can be made of a biomass-containing material which will be described later, and thus, energy required for producing the generator 100 can be reduced.

The magnet 108 is slidably accommodated to the sliding member 105. The magnet 108 slides inside the sliding member 105 to pass through the coil 106, when the generator 100 is tilted from the horizontal plane or when vibration is applied to it. When the magnet 108 passes through the coil 106, the electromagnetic induction at the coil 106 is caused, and the electrical power is generated. The shape and the material of the magnet 108 are not particularly limited, and those in which the friction coefficient against the sliding member 15 is small are favorable.

In addition, in this embodiment, the coil 106 and the magnet 108 may be reversed. That is, it is also possible that the coil 106 is accommodated to the sliding member 105 and is configured to slide inside the sliding member 105, and the magnet 108 is fixed to the sliding member 105.

[About Biomass-Containing Material]

As described above, the sliding member 105, the casing 101 and the coil stopper 107 can be those made of a biomass-containing material. Specific examples of the biomass-containing materials include a polylactic acid with the use of saccharide as a raw material; bio-polycarbonate; bio-PET (polyethylene terephthalate); bio-PP (polypropylene); and bio-PE (polyethylene); and polyamide 11, polyamide 10•10 and polyamide 6•10 derived from castor oil. Examples of polysaccharides include cellulose, starch, chitin, chitosan, dextran and any of their derivatives, or copolymers containing at least one of them. In addition, in order to impart thermoplasticity to the polysaccharides, various plasticizers may be added thereto.

In addition to the thermoplastic bio-plastics described above, the biomass-containing materials also include a thermoplastic elastomer resin using a bio-plastic for a hard segment part of the thermoplastic elastomer resin that forms the hard segment and soft segment. The "thermoplastic elastomer" means a resin having characteristics of softening and exhibiting flowability by application of heat and of returning to the original rubber-like elastic body by cooling.

Further, the biomass-containing materials include biodegradable plastics. By utilizing the biodegradable plastic, it allows the sliding member 105, the casing 101 and the coil stoppers 107 to be biodegradable. The definition of the "biodegradable plastic" is the plastic which can be resolved into low molecular weight compounds, and eventually into water and carbon dioxide, by involvement of microorganisms in nature after use (Biodegradable Plastics Society, ISO/TC-207/SC3).

Examples of biodegradable polymers as the raw materials of such biodegradable plastics include polysaccharide derivatives such as cellulose, starch, dextran and chitin; peptides such as collagen, casein, fibrin and gelatin; polyamino acids; polyvinyl alcohol; polyamides such as nylon 4 and nylon 2/nylon 6 copolymer; and polyesters such as polyglycolic acid, polylactic acid, polysuccinic acid ester, polyoxalic acid ester, polyhydroxy butyric acid, polybutylene diglycolic acid, polycaprolactone and polydioxanone.

The biomass-containing materials described above are not limited to those composed of the biomass material only. Those containing 5 to 100 wt % of the biomass material, more desirably 25 wt % or more, are favorable. The biomass-containing materials can be those other than plastics, and can also be a fiber, chip or powdered material with the use of biomass as a raw material.

In addition, the biomass-containing material can further contain an additive agent. Examples of additive agents that can be used include plasticizers, flame retardants, light resistance improving agents, coloring agents, release agents, dispersing agents, antioxidants, crystallization accelerators, hydrolysis controlling agents, ultraviolet absorbers, fillers (reinforcing agents), thermal stabilizers, lubricants and the like.

Favorable physical properties of the biomass-containing material are as follows. Melting temperature of the resin is favorable to be from 140 to 320° C., and more desirably, from 180 to 250° C. Melt flow rate (index of molten state of the resin) is favorable to be from 0.5 to 30 grams per 10 minutes, and more desirably, from 0.5 to 5 grams per 10 minutes. Storage modulus of the resin at room temperature is favorable to be from 0.01 GPa to 20 GPa, and more desirably, from 0.1 GPa to 10 GPa. Incidentally, in components of the energy produced by external force and strain to the object, "storage modulus" is the component to be stored inside an object, and "loss modulus" is the component that diffuses to the outside, and they can be measured by a dynamic viscoelasticity measuring apparatus.

[Material of Sliding Member]

The sliding member 105 can be one made of the biomass-containing material as described above. Among the biomass-containing materials, those in which the friction coefficient is small are favorable. This is because, since the magnet 108 slides inside the sliding member 105 as described above, the movement of the magnet 108 is not hindered by the friction between the sliding member 105 and the magnet 108 if the friction coefficient of the sliding member 105 is small.

Examples of the biomass-containing materials which are favorable from the viewpoint of the friction coefficient for the sliding member 105 include a mixed resin of polymethyl methacrylate and polylactic acid (for example, "Ecodear CA11-049" produced by Toray Industries, Inc.), and a polyamide resin (for example, "Rilsan Clear G830" produced by Arkema Inc., and "Grilamid XE 4010" produced by EMS-Chemie Inc.). In the case where the mixed resin of polymethyl methacrylate and polylactic acid (PMMA/PLA) is employed, the content ratio of the polylactic acid as the biomass material, in the resin, is 25 wt %; and even in such cases where the content ratio of the biomass material (polylactic acid) in a material is small, such a material should be encompassed in the "biomass-containing material" in the present disclosure as well.

FIG. 3 shows measurement results of kinetic friction coefficient and static friction coefficient of each of the biomass-containing materials (materials A, B and C) and material D for comparison which does not contain biomass materials (hereinafter simply referred to as "non-biomass material").

In the following description, a mixed resin of polymethyl methacrylate and polylactic acid ("Ecodear CA11-049" produced by Toray Industries, Inc.), a polyamide resin ("Grilamid XE 4010" produced by EMS-Chemie Inc.) and another polyamide resin ("Rilsan Clear G830" produced by Arkema Inc.), which are the biomass-containing materials, are respectively represented by the materials A, B and C; and a polymethyl methacrylate resin ("Acrypet VH-001") of the comparative is represented by the material D. Further, FIG. 4 shows each of the physical property values of the materials A to C. It should be noted that "PLA" shown in FIG. 4 means "polylactic acid", and "PA" means "polyamide". Each kinetic friction coefficient and static friction coefficient shown in FIG. 3 was measured by the measurement of friction coefficient in conformity to JIS-K7125 standard. Specifically, the measurement conditions were at the temperature: 23±1° C.; humidity: 50±5% RH; sliding piece: 80×80 mm; mating material: SUS304 (stainless steel); measuring apparatus: INSTRON model 5566 tensile mode; load FS: 100 N; and test speed: 100 mm/min.

As shown in FIG. 3, the values of kinetic friction coefficient and static friction coefficient of the materials A to C, which are the biomass-containing materials, were smaller compared to the comparative material D. That is, while the static friction coefficient of the polymethyl methacrylate resin (material D) which is non-biomass material is 0.23, the materials A to C have the values about 20% to 30% smaller than that, which values are 0.19 or less. Therefore, by employing the sliding member 105 made of the biomass-containing material, it is able to improve the sliding ability of the magnet 108. For example, if assumed that the sliding member 105 is made of the material A, the minimum acceleration for movement of the magnet 108 would be reduced by 68.5% from 0.54 G to 0.17 G.

FIGS. 5 and 6 are measurement results for friction of the biomass-containing materials and the comparative non-biomass material. As shown in these figures, it can be said that the biomass-containing materials are suitable for use as the sliding member as compared to the non-biomass material.

Incidentally, each sample mass change (wear mass) and kinetic friction coefficient shown in FIGS. 5 and 6 was measured by the testing method for sliding wear resistance in conformity to JIS-K7218A standard. Specifically, the measurement conditions were with the test piece: 30×30×t3 mm; mating material: S45C ring (surface roughness: 0.8 μmRa); sliding speed: 0.5 m/s; load: 50 N; test duration: 100 minutes; temperature: 23±2° C.; humidity: 50±10% RH; and measuring apparatus: friction and wear tester EMF-3-F produced by Orientec Co., Ltd.

FIG. 6 is a result showing the temporal changes of the kinetic friction coefficient μ. After a 5-minute period, the materials B and C had larger kinetic friction coefficient than the material D which is a comparative example. However, when an extended period of time as 60-minute, or 100-minute, had passed, the materials A to C derived from plants had little changes in the kinetic friction coefficient and were revealed to be able to be used efficiently for a long time.

As described above, the friction coefficients (kinetic friction coefficient and static friction coefficient) of a biomass-containing material are small and the wear mass is small. Therefore, by employing the sliding member 105 made of the biomass-containing material, the generator 100 which is excellent in the sliding ability of the magnet 108 can be obtained. Consequently, as will be described later, improvement of power generation performance of the generator 100 may be realized.

In addition to that, since the mixed resin of polymethyl methacrylate and polylactic acid has small friction coefficient and has transparency, it is favorable as the biomass-containing material to be utilized to make the sliding member in a generator in which visibility of the inside is demanded (see Application Example 1 below). Besides, since a polyamide resin derived from castor oil has small friction coefficient, high durability, and sufficient waterproof and antifouling properties, it is favorable as the biomass-containing material to be utilized to make the sliding member in a generator in which durability is demanded (see Application Example 2 below). Furthermore, since a polylactic acid resin derived from starch has small friction coefficient and has biodegradability, it is favorable as the biomass-containing material to be utilized to make the sliding member in a generator in which biodegradability is demanded (see Application Example 5 below).

[Production Method]

Each member of the generator 100 (casing 101, sliding member 105 or coil stopper 107) using the biomass-containing material is able to be formed by any production method. Specifically, injection molding, blow molding, tube forming, pressure forming, film forming, extrusion molding or the like can be used, and injection molding may be especially desirable. More specifically, extrusion molding may be according to a usual method performed using a known extruder for example, a single-screw extruder, multi-screw extruder, tandem extruder or the like.

Effects of this Embodiment

Figure 7:
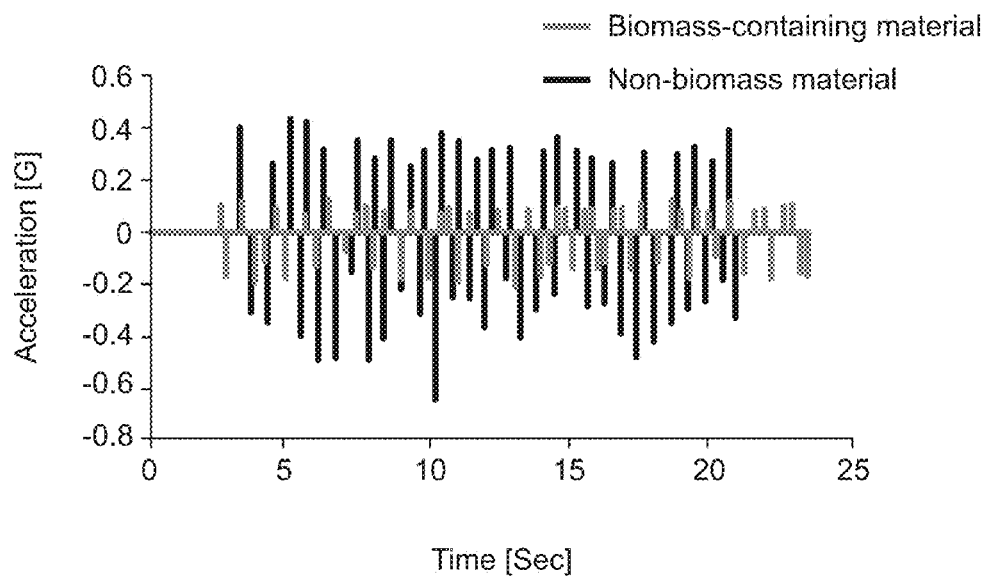
FIG. 7 is a measurement result of lower limit of vibration condition of power generation of the generator and of a comparative generator.

Effects of the generator according to this embodiment will be described. FIG. 7 is a graph showing a comparison of lower limits of vibration condition of power generation. This figure shows the minimum acceleration for enabling power generation in the generator 100 according to this embodiment and a comparative generator (hereinafter referred to as "generator α"). The generator α is one having a sliding member made of a non-biomass material in place of the sliding member 105 of the generator 100. In FIG. 7, the measured values for the generator 100 are shown as "biomass containing material" and the measured values for the generator α are shown as "non-biomass material".

The graphs shown in this figure was obtained from the measurement by, after installing a 3-axis acceleration sensor and the generator to be measured on a vibration generator and allowing the vibration speed by the vibration generator to gradually increase, measuring the acceleration, vibration frequency and output voltage of the generator at the time at which the output of the generator to be measured exceeded the threshold value.

In FIG. 7, the results with the case of the generator 100 (biomass-containing material) were maximum acceleration: 0.17 G; average acceleration: 0.12 G; minimum acceleration: 0.07 G; and the average frequency: 1.17 Hz. The results with the case of the generator α (non-biomass material) were maximum acceleration: 0.54 G; average acceleration: 0.37 G; minimum acceleration: 0.20 G; and the average frequency: 1.45 Hz. That is, the generator 100 was found to be capable of generating power by smaller acceleration (reduced by 68.5%) and smaller vibration frequency (reduced by 19.3%) as compared to the generator α. Therefore, it can be said that the power generation by the generator 100 according to this embodiment is possible by weaker vibration as compared to the generator using the non-biomass material, and that the ease of power generation has been improved.

Figure 8:
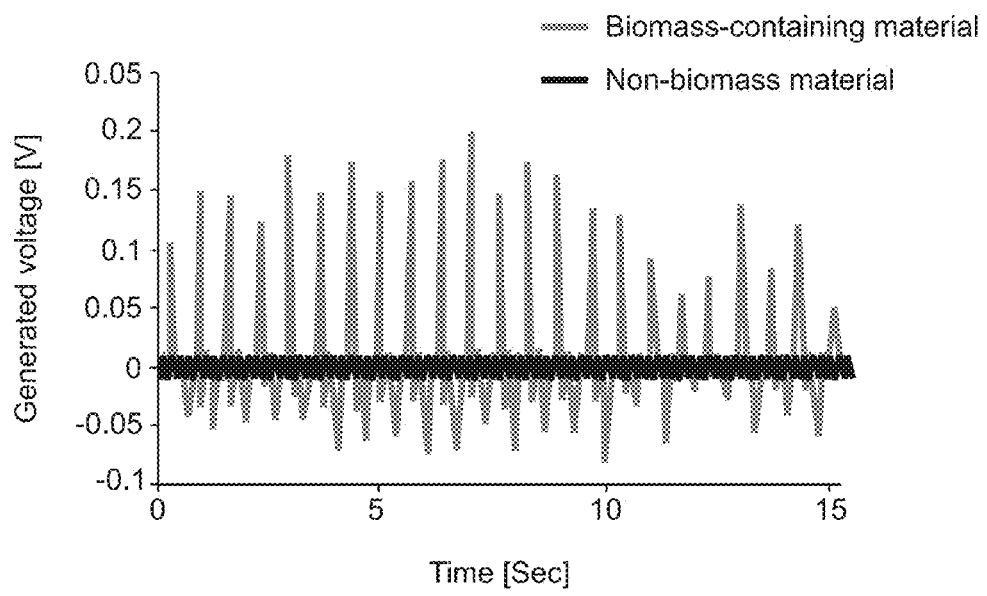
FIG. 8 is a measurement result of amount of power generation of the generator and of a comparative generator.

FIG. 8 is a graph showing a comparison of amount of power generation. This figure shows the amount of power generation in the generator 100 according to this embodiment and the comparative generator α at a specific vibration frequency. The specific vibration frequency is a vibration frequency at the lower limit in the generator α in the measurement of the lower limit of vibration for power generation described above. In FIG. 8, the measured values for the generator 100 are shown as "biomass containing material" and the measured values for the generator α are shown as "non-biomass material".

The graphs shown in this figure was obtained from the measurement by, after installing a 3-axis acceleration sensor and the generator to be measured on a vibration generator, measuring the output voltage of the generator at the vibration frequency of the lower limit of the generator α.

In FIG. 8, the results with the case of the generator 100 (biomass-containing material) were resistance: 26.7Ω; peak-to-peak voltage (Vp-p): 279 mV; maximum voltage (Vmax): 198 mV; maximum power: 714 μW; and ∫Vdt: 0.30. The results with the case of the generator α (non-biomass material) were resistance: 26.9Ω; peak-to-peak voltage (Vp-p): 27 mV; maximum voltage (Vmax): 15 mV; maximum power: 7 μW; and ∫Vdt: 0.05. That is, in the generator 100 according to this embodiment, the peak-to-peak voltage was 10.3 times larger, the generated maximum voltage was 13.2 times larger and the generated maximum power was 102 times larger than in the generator using the non-biomass material. Therefore, it can be said that the generator 100 according to this embodiment is capable of generating greater electrical power as compared to the generator using the non-biomass material, even from the same vibration.

As described above, by the good sliding ability between the sliding member 105 and the magnet 108 that are made of the biomass-containing material in the generator 100 according to this embodiment, it is able to improve the power generation performance of the generator 100, as compared to the generator having the sliding member made of the non-biomass material.

Second Embodiment

A generator according to a second embodiment of the present disclosure will be described. A configuration of the generator according to this embodiment except for the power generation section is substantially the same as in the first embodiment, and hence the description will be omitted.

Figure 9A:
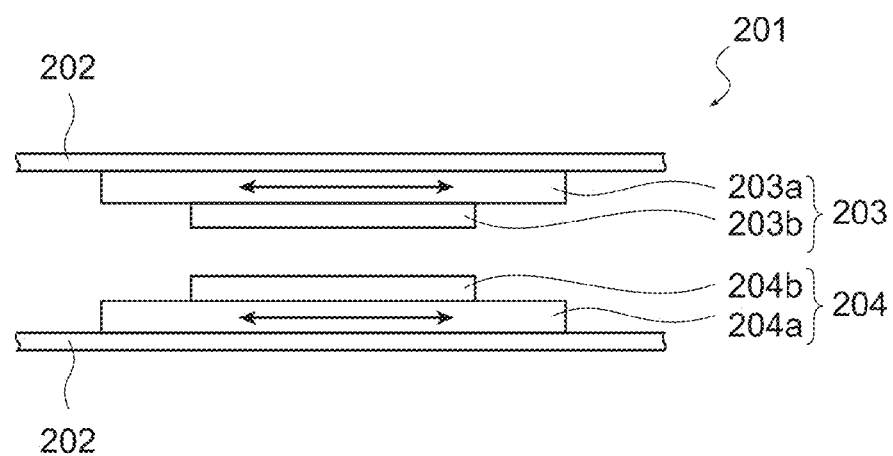
FIGS. 9A and 9B are schematic diagrams showing a power generation section of a generator according to a second embodiment of the present disclosure.
Figure 9B:
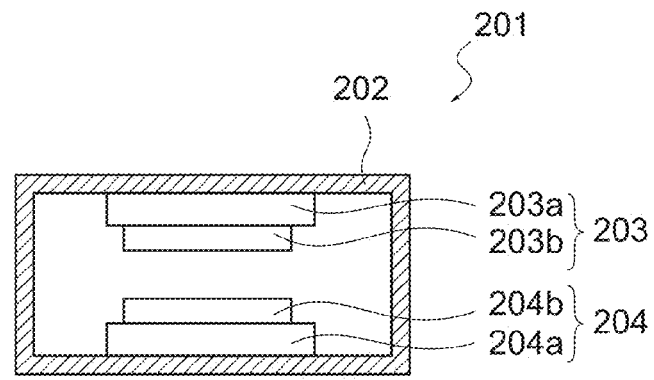

FIGS. 9A and 9B are schematic diagrams showing a power generation section 201 of the generator according to this embodiment. FIG. 9A is a plan view of the power generation section 201, and FIG. 9B is a cross-sectional view of the power generation section 201. As shown in these figures, the power generation section 201 includes a sliding member 202, a coil part 203 and a magnet part 204. The sliding member 202 is fixed to a casing (not shown). The coil part 203 and the magnet part 204 are slidably mounted to the sliding member 202, individually.

The sliding member 202 is a member to enable sliding of the coil part 203 and the magnet part 204 with respect to the sliding member 202. Specifically, the sliding member 202 has a cylindrical shape and is configured to accommodate the coil part 203 and the magnet part 204 in its interior. The coil part 203 and the magnet part 204 are not fixed to the sliding member 202, that is, when the sliding member 202 is tilted from the horizontal plane, or when vibration is applied to it, the coil part 203 and the magnet part 204 slide with respect to the sliding member 202. The sliding member 202 is not limited to cylindrical shape, and may be any shape that enables sliding of the coil part 203 and the magnet part 204. The sliding member 202 can be made of the biomass-containing material as in the first embodiment.

The coil part 203 includes a supporting member 203a and a coil 203b. The supporting member 203a supports the coil 203b, and is configured to slide on the sliding member 202 when the generator is tilted or when vibration is applied to it. The coil 203b is fixed to the supporting member 203a, and it moves with respect to the sliding member 202, along with the sliding of the supporting member 203a on the sliding member 202. The supporting member 203a can be one made of any of the various biomass-containing materials described in the first embodiment.

The magnet part 204 includes a supporting member 204a and a magnet 204b. The supporting member 204a supports the magnet 204b, and is configured to slide on the sliding member 202 when the generator is tilted or when vibration is applied to it. The magnet 204b is fixed to the supporting member 204a, and it moves with respect to the sliding member 202, along with the sliding of the supporting member 204a on the sliding member 202. The supporting member 204a can be one made of any of the various biomass-containing materials described in the first embodiment.

By the coil part 203 and the magnet part 204 thus sliding over the sliding member 202 independently, the relative position of the coil 203b and the magnet 204b varies and the power generation is made by electromagnetic induction. Therefore, by employing the sliding member 202, the supporting member 203a and the supporting member 204a which are made of the biomass-containing material in which the friction coefficient is small, it is able to improve the power generation performance.

Further, in this embodiment, it is also possible to dispose an electrode in place of the coil 203b and dispose a dielectric substance such as an electret in place of the magnet 204b, to generate a potential difference caused by electrostatic induction of the electrode and the electret, thereby generating power.

Third Embodiment

A generator according to a third embodiment of the present disclosure will be described. A configuration of the generator according to this embodiment except for the power generation section is substantially the same as in the first embodiment, and hence the description will be omitted.

Figure 10A:
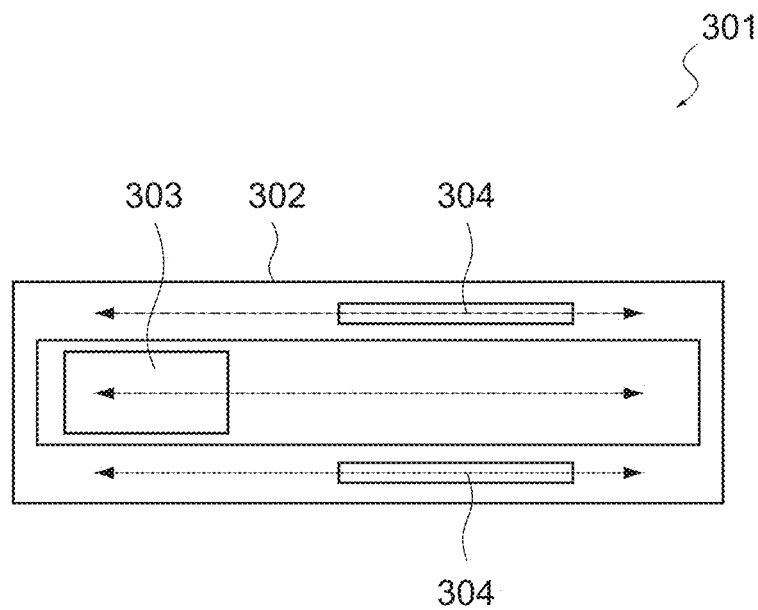
FIGS. 10A and 10B are schematic diagrams showing a power generation section of a generator according to a third embodiment of the present disclosure.
Figure 10B:
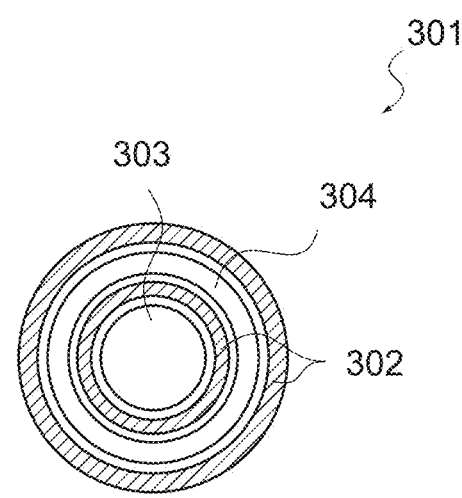

FIGS. 10A and 10B are schematic diagrams showing a power generation section 301 of the generator according to this embodiment. FIG. 10A is a plan view of the power generation section 301, and FIG. 10B is a cross-sectional view of the power generation section 301. As shown in these figures, the power generation section 301 includes a sliding member 302, a coil 303 and a magnet 304. The sliding member 302 is fixed to a casing (not shown). The coil 303 and the magnet 304 are slidably mounted to the sliding member 302, individually.

The sliding member 302 is a member to enable sliding of the coil 303 and the magnet 304 with respect to the sliding member 302. Specifically, the sliding member 302 has a double cylinder shape with an inner peripheral space and an outer peripheral space, and is configured to accommodate the coil 303 in the inner peripheral space, the magnet 304 in the outer peripheral space. The coil 303 and the magnet 304 are not fixed to the sliding member 302, that is, when the sliding member 302 is tilted from the horizontal plane, or when vibration is applied to it, the coil 303 and the magnet 304 each slides with respect to the sliding member 302. The sliding member 302 is not limited to double cylinder shape, and may be any shape that enables sliding of the coil 303 and the magnet 304. The sliding member 302 can be made of the biomass-containing material as in the first embodiment.

The coil 303 is slidably accommodated to the inner peripheral space of the sliding member 302. The coil 303 slides inside the sliding member 302 when the generator is tilted or when vibration is applied to it. The shape and the material of the coil 303 are not particularly limited, and those in which the friction coefficient against the sliding member 302 is small are favorable.

The magnet 304 is slidably accommodated to the outer peripheral space of the sliding member 302. The magnet 304 can be one having a cylindrical shape, and a shape thereof is not particularly limited. The magnet 304 slides inside the sliding member 302 when the generator is tilted or when vibration is applied to it.

By the coil 303 and the magnet 304 thus sliding inside the sliding member 302 independently, the relative position of the coil 303 and the magnet 304 varies and the power generation is made by electromagnetic induction. Therefore, by employing the sliding member 302 which is made of the biomass-containing material in which the friction coefficient is small, it is able to improve the power generation performance.

Further, in this embodiment, it is also possible to dispose an electrode in place of the coil 303 and dispose a dielectric substance such as an electret in place of the magnet 304, to generate a potential difference caused by electrostatic induction of the electrode and the electret, thereby generating power.

Fourth Embodiment

A generator according to a fourth embodiment of the present disclosure will be described. A configuration of the generator according to this embodiment except for the power generation section is substantially the same as in the first embodiment, and hence the description will be omitted.

Figure 11A:
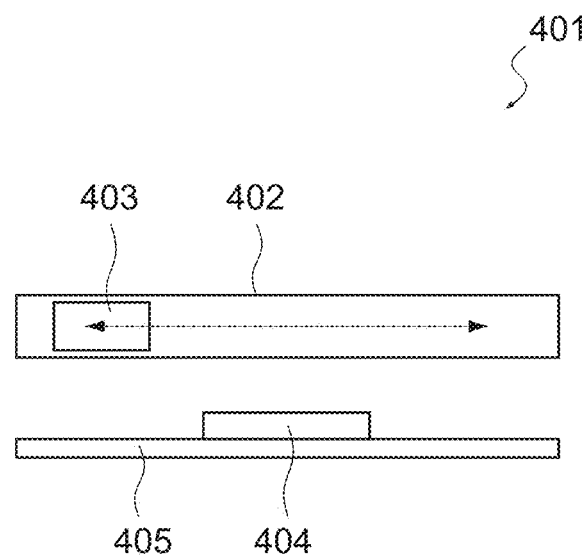
FIGS. 11A and 11B are schematic diagrams showing a power generation section of a generator according to a fourth embodiment of the present disclosure.
Figure 11B:
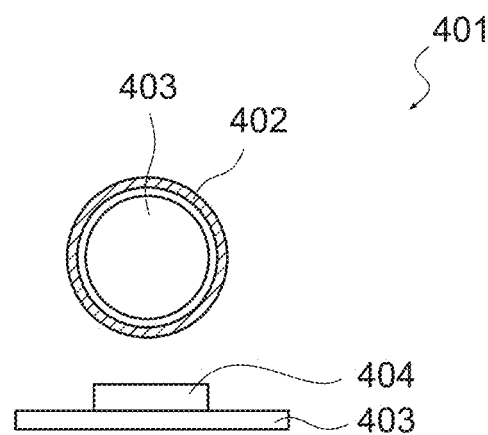

FIGS. 11A and 11B are schematic diagrams showing a power generation section 401 of the generator according to this embodiment. FIG. 11A is a plan view of the power generation section 401, and FIG. 11B is a cross-sectional view of the power generation section 401. As shown in these figures, the power generation section 401 includes a sliding member 402, a dielectric substance 403, an inductive circuit 404 and a supporting member 405. The sliding member 402 and the supporting member 405 are fixed to a casing (not shown). The dielectric substance 403 is slidably accommodated to the sliding member 402. The inductive circuit 404 is fixed to the supporting member 405.

The sliding member 402 is a member to enable sliding of the dielectric substance 403 with respect to the sliding member 402. Specifically, the sliding member 402 has a cylindrical shape and is configured to accommodate the dielectric substance 403 in its interior. The sliding member 402 is not limited to cylindrical shape, and may be any shape that enables sliding of the dielectric substance 403. The sliding member 402 can be made of the biomass-containing material as in the first embodiment.

The dielectric substance 403 is made of a dielectric material, and is slidably accommodated to the sliding member 402. The dielectric substance 403 is not fixed to the sliding member 402, that is, when the sliding member 402 is tilted from the horizontal plane, or when vibration is applied to it, the dielectric substance 403 slides with respect to the sliding member 402. The shape and the material of the dielectric substance 403 are not particularly limited, and those in which the friction coefficient against the sliding member 402 is small are favorable.

The inductive circuit 404 is a circuit that causes electrostatic induction between the dielectric substance 403 and the inductive circuit 404. Its configuration is not particularly limited. The induction circuit 404 is supported by the supporting member 405, and its position is fixed with respect to the casing.

The supporting member 405 supports the inductive circuit 404 at the casing. The material and the shape of the supporting member 405 are not particularly limited, and by employing the supporting member 405 which is made of any of the various biomass-containing materials as in the first embodiment, energy required for producing the generator can thus be reduced.

When vibration or tilt is applied to the generator, the dielectric substance 403 slides inside the sliding member 402, and between the dielectric substance 403 and the inductive circuit 404, a potential difference occurs by the electrostatic induction. Therefore, by employing the sliding member 402 which is made of the biomass-containing material in which the friction coefficient is small, it is able to improve the power generation performance.

In addition, in this embodiment, the dielectric substance 403 and the inductive circuit 404 may be reversed. That is, it is also possible that the inductive circuit 404 is accommodated to the sliding member 402 and is configured to slide inside the sliding member 402, and the dielectric substance 403 is fixed to the supporting member 405.

Fifth Embodiment

A generator according to a fifth embodiment of the present disclosure will be described. A configuration of the generator according to this embodiment except for a sliding part is substantially the same as in the first embodiment, and hence the description will be omitted.

Figure 12A:
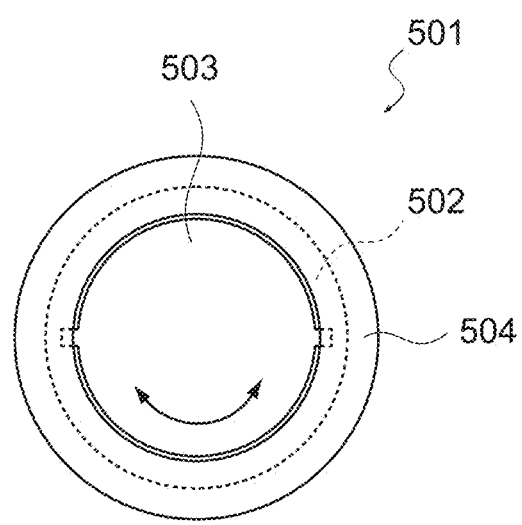
FIGS. 12A and 12B are schematic diagrams showing a power generation section of a generator according to a fifth embodiment of the present disclosure.
Figure 12B:
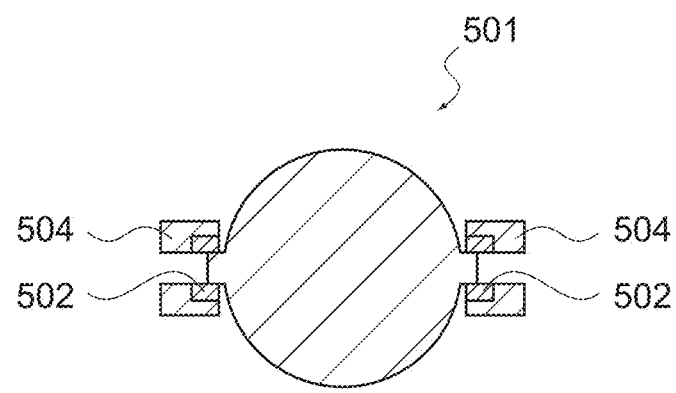

FIGS. 12A and 12B are schematic diagrams showing a sliding part 501 of the generator according to this embodiment. FIG. 12A is a plan view (top view) of the sliding part 501, and FIG. 12B is a cross-sectional view of the sliding part 501. As shown in these figures, the sliding part 501 includes a sliding member 502, a rotating body 503 and a guide 504. The guide 504 is fixed to a casing (not shown). The sliding member 502 is fixed to the guide 504. The rotating body 503 has a spherical shape as in FIG. 12A and is slidably fitted to the sliding member 502 via two protrusions provided on the rotating body 503. Further, although not shown, a structure body, which makes a pair with the rotating body 503 which is a power generation element, is provided around the rotating body 503. This can generate electrical power from variation of the relative position between the rotating body 503 and the structure body.

The sliding member 502 here represents a bearing or shaft bearing (part contacting with the rotating body 503) which is used in the generator. In a so-called gyro power generation method, typically, a type in which a magnet or the like is directly embedded into the rotating body to generate electrical power therefrom, or, a type in which the rotating body and the portion for the relative movement to it are without power generation elements and are configured to generate precessions, is used. In the latter case, a member that makes a pair of power generation elements would be installed at the location which has no relation to the rotating body. However, since there may be application of external force in order to maintain the speed of the rotating body, there is a demand to reduce friction of the periphery of the rotating body, so as to reduce this external force even slightly. In this case, even if the member making a pair with the power generation element is not located around the rotating body, eventually, system efficiency is able to be improved by reducing the friction of the periphery of the rotating body indirectly.

The sliding member 502 is a member to enable sliding of the rotating body 503 with respect to the sliding member 502. Specifically, the sliding member 502 can be one having an annular rail-like shape. The sliding member 502 is not limited to such a shape, and may be any shape that enables sliding of the rotating body 503. The sliding member 502 can be made of the biomass-containing material as in the first embodiment.

The rotating body 503 rotates, by sliding with respect to the sliding member 502. Any one power generation element of the pair of power generation elements described above (the coil and the magnet; or the dielectric substance including the electret and the inductive circuit) may be accommodated to the rotating body 503 or the pair of power generation elements may be provided in the other place. Further, the rotating body 503 may be made of the biomass-containing material. In this case, the sliding member 502 may be one which is not made of the biomass-containing material, but it is desirable to be one made of the biomass-containing material.

The guide 504 can be one in which a power generation element which makes a pair with the power generation element that is accommodated to the rotating body 503 is accommodated. Further, the guide 504 can also be made of the biomass-containing material.

In the case where one power generation element of the pair of power generation elements described above (the coil and the magnet; or the dielectric substance including the electret and the inductive circuit) has been accommodated to the rotating body 503, when the rotating body 503 slides the sliding member 502 to rotate with respect to the guide 504, the relative position of the pair of power generation elements each accommodated to the corresponding one of the rotating body 503 and the guide 504 varies, and the electrical power is generated. Besides, in the case where one power generation element of the pair of power generation elements described above (the coil and the magnet; or the dielectric substance including the electret and the inductive circuit) is not accommodated, for example, when using the precession by the rotation of the rotating body 503, it is necessary to initially rotate the rotating body 503 or maintain the rotation thereof by external energy, and it requires power consumption if the friction is large. Therefore, by employing the sliding member 502 which is made of the biomass-containing material in which the friction coefficient is small, it is able to suppress the power consumption and improve the power generation performance.

Figure 13A:
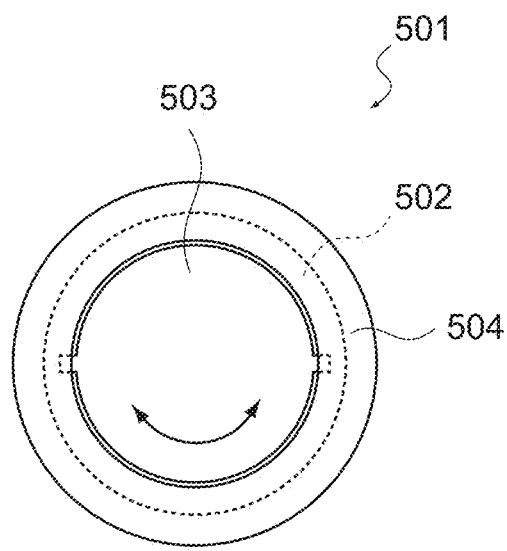
FIGS. 13A and 13B are schematic diagrams showing a power generation section of a generator according to a fifth embodiment of the present disclosure.
Figure 13B:
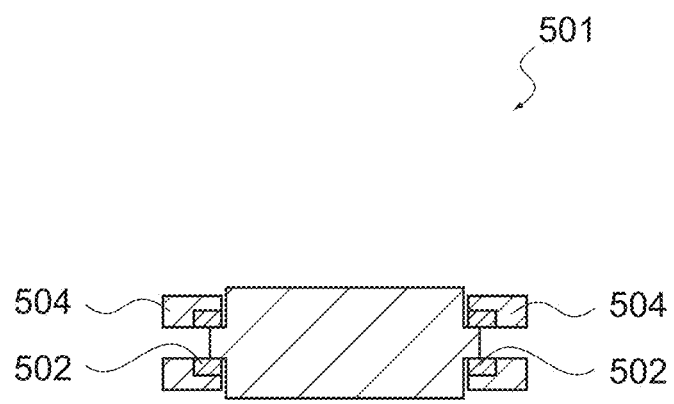
Figure 14A:
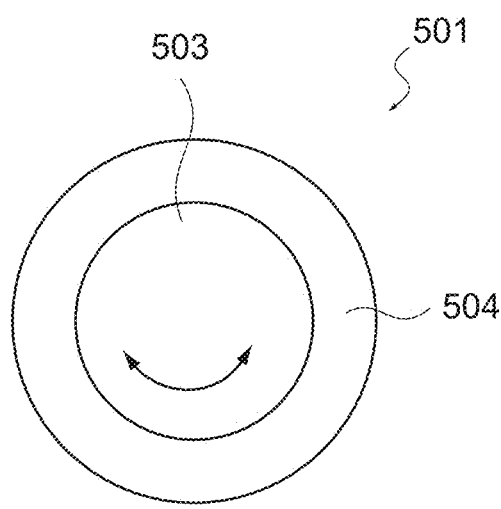
FIGS. 14A and 14B are schematic diagrams showing a power generation section of a generator according to a fifth embodiment of the present disclosure.
Figure 14B:
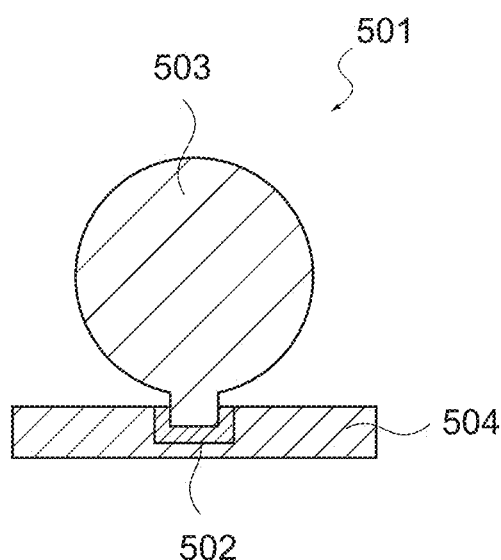
Figure 15A:
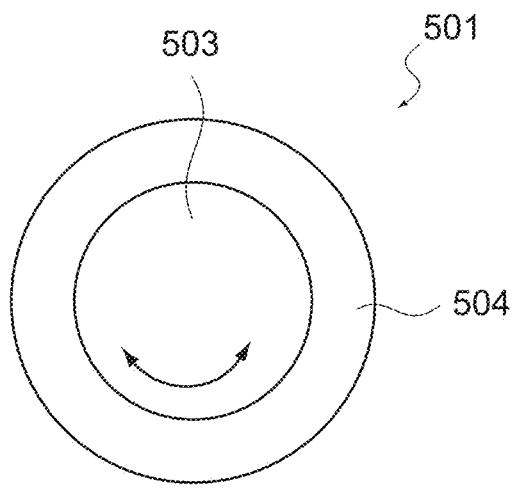
FIGS. 15A and 15B are schematic diagrams showing a power generation section of a generator according to a fifth embodiment of the present disclosure.
Figure 15B:
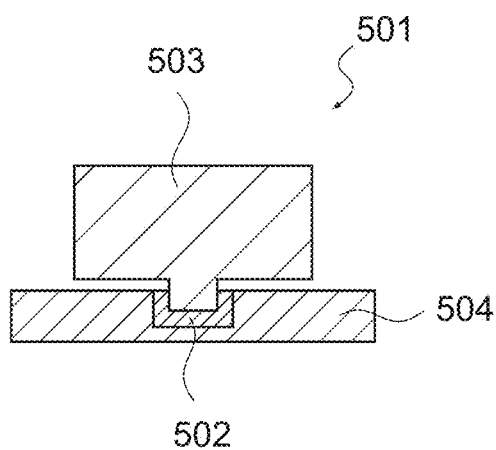

FIGS. 13A and 13B to 15A and 15B are schematic diagrams showing other forms of the sliding part 501 according to this embodiment. Each of FIGS. 13A, 14A and 15A is a plan view (top view) of the sliding part 501, and each of FIGS. 13B, 14B and 15B is a cross-sectional view of the sliding part 501. As shown in these figures, it is possible to modify the shapes of the sliding member 502 and the rotating body 503 as appropriate.

FIGS. 13A and 13B show an example in which a rotating body 503 having a cylindrical shape is employed, in place of the rotating body 503 having a spherical shape in FIGS. 12A and 12B.

In a sliding part 501 in FIGS. 14A and 14B, a rotating body 503 having a spherical shape is slidably fitted to a sliding member 502 via a protrusion provided on the rotating body 503. The sliding member 502 is provided at a substantially central portion of a guide 504, and the guide 504 is fixed to the casing (not shown).

FIGS. 15A and 15B show an example in which a rotating body 503 having a cylindrical shape is employed, in place of the rotating body 503 having a spherical shape in FIGS. 14A and 14B.

In each of the configurations in FIGS. 13A to 15B, although not shown, it should be noted that a structure body, which makes a pair with the rotating body 503 which is a power generation element, is provided around the rotating body 503. This can generate electrical power from variation of the relative position between the rotating body 503 and the structure body.

It should be noted that the shapes and configurations of the sliding part 501, the sliding member 502, the rotating body 503, the guide 504 and the like which are shown in FIGS. 12A to 15B are merely examples, and it is also possible to employ other shapes and configurations.

APPLICATION EXAMPLES

Application Examples of the generators according to the above embodiments of the present disclosure will be described.

Application Example 1

Vibration-powered generator kit for education: one which is not so high spec as CE (Consumer Electronics) devices, and in which the durability is not limited A vibration-powered generator kit for education will be illustrated as Application Example 1 of the present disclosure. This vibration-powered generator is one using an electromagnetic induction method, for example, and is a study tool for learning the mechanism of power generation. The characteristics to be demanded for this use are high visibility of the internal structure and an ease of the assembly.

In addition, since such a generator is handled by a child with little physical strength in many cases, the sliding member is necessary to be a material in which the static friction coefficient and kinetic friction coefficient is small, so that the magnet can easily be moved by vibration at low acceleration and low frequencies.

As a resin material to realize them, in the sliding member, the mixed resin of polymethyl methacrylate and polylactic acid (the above-mentioned material A), which is the biomass-containing material, can be employed.

The material A has favorable frictional properties in the frictional sliding properties and also has transparency. According to FIG. 3, the static friction coefficient as measured in conformity to JIS-K7125 standard was that while the static friction coefficient of the polymethyl methacrylate resin (the above-mentioned material D) which is non-biomass material is 0.23, the materials A to C have the values about 20% to 30% smaller than that, which values are 0.19 or less. The kinetic friction coefficient as a result of the test of the sliding wear resistance in conformity to JIS-K7218A standard was that while the kinetic friction coefficient of the material D of the comparative example after a 60-minute period, and 100-minute period, is 0.47, the kinetic friction coefficient of the materials A to C of the present disclosure have shown the lower values, which values are 0.44 or less.

Consequently, the minimum acceleration for movement of the magnet has been reduced by 68.5% from 0.54 G to 0.17 G. Thus, at the lower limit of vibration for power generation, an output difference of about 100-fold was observed between the case where the material as in the past was used in the sliding member and the case where the biomass-containing material was used. The coil stoppers can be those made of the polyamide resin (the above-mentioned material C). In the past, a silicone rubber or rubber material has been used, but it has been difficult to obtain sufficient rigidity to carry the coil and it has no transparency.

In contrast to this, the material C has sufficient rigidity and has transparency. As a material of a stopper to prevent the magnet from falling out, by using PA (polyamide), it is able to realize fixation of the magnet utilizing elasticity, and prevention of destruction of the casing due to collision of the magnet to the casing, and further, a structure that eliminates the loss of kinetic energy. As a material of the casing, the polyamide resin (the above-mentioned material B) may be used. This can improve transparency, shock resistance and abrasion resistance as compared to PP (polypropylene) used in the past. Thus, by using such environmental friendly materials superior in functional aspects as compared to the materials of the past, it is able to obtain advantages in terms of cost for achieving the same performance, in addition to realization of a device having higher functionality than the devices of the past.

Application Example 2

CE (Consumer Electronics) device: one which is for portable use, and in which a durability of about 3 years is demanded A generator integrated portable electronic apparatus will be illustrated as Application Example 2 of the present disclosure. This apparatus is a small apparatus which can be carried by a person, and has any one or some of the features to perform music reproduction, video image reproduction, still image reproduction, sound recording, video recording, communication, and processes by computing circuit. The designability, durability (dropping impact, less aging deterioration, waterproof, and antifouling properties) and flame resistance are demanded. Further, if an ability to generate electrical power by carrying this apparatus is demanded, the power generation by less acceleration is demanded.

In addition, the vibration frequency is low (about 1 kHz). Therefore, this apparatus is necessary to have an environmental friendly material corresponding to electronic products in addition to the configuration mentioned in Application Example 1. In particular, the casing, usually, is necessary to have sufficient flame resistance and dropping impact strength, and it is desirable to utilize the polyamide material derived from castor oil as listed in FIG. 4 (the above-mentioned material B or C) in which the flame resistance corresponds to UL94 HB and the dropping impact strength (Charpy impact strength) corresponds to 9 to 10 kJ/m$^2$. Since it has the features as mentioned in Application Example 1 also in the case where such a material is used, it is able to obtain advantages in terms of cost as compared to the case where a material of the past is used for achieving the same performance.

Incidentally, "UL94" of flammability standard as mentioned in FIG. 4 is a standard that represents a degree of material's non-flammability by Tests for Flammability of Plastic Materials for Parts in Devices and Appliances. In the UL94 standard, the biomass-containing materials A to C herein are materials that can pass the UL94 HB test. This test makes the determination by holding a test piece (($125\pm5$)× ($13\pm0.5$)×t mm) horizontally and exposing the test piece to a 20 mm flame for 30 seconds, based on burning rate between bench marks spaced at 75 mm.

Application Example 3

Wireless sensor: one which is intended for use of about 5 years after installation as a mobile object (small/thin structure)

A wireless sensor will be illustrated as Application Example 3 of the present disclosure. It is demanded to be small and thin. Operating environment for this Application Example is at high vibration frequency, large acceleration (necessary to correspond to the acceleration of over 3 G), and also includes a high-temperature part over 100° C., in which the vibration frequency is also often high (1 kHz or more). The designability is not demanded. As a generator, power generation from vibration of the mobile object, power generation from heat, and the like, can be assumed. Taking into account the generator to be assumed and the operating environment which is at high temperature and high impact, it is favorable to use, as the environmental friendly material, a recycled PC (Polycarbonate) material with the use of waste optical discs and the like as a raw material. It is able to obtain advantages in terms of cost for achieving the same performance.

Application Example 4

Non-electric source switch: one which is intended for use of about 10 years at the same place after installation, and is free from discoloration A non-electric source switch will be illustrated as Application Example 4 of the present disclosure. Compared to Application Examples 1 to 3, the number of installation of the non-electric source switches is large and the designability and antifouling properties are demanded. On the other hand, in the indoor use, temperature and humidity environment is constant to some extent, and heat resistance is not demanded. Various generators to be used can be assumed, which may include power generation using human power such as actions of pressing and releasing the switch, and power generation using sunlight, heat, radio waves, sugars, or the like. From the viewpoint of high designability and from low resistance to environmental degradation, the corresponding materials may be polylactic acid compositions or polyamide materials with their durability improved. With such a configuration, it is able to obtain advantages in terms of cost for achieving the same performance as in the case where a material of the past is used.

Application Example 5

Animal ecosystem investigation sensor, environmental sensor: one which decomposes in a few years after installation, and which is demanded to be with less environmental burden, do not hurt the animal (less-lethal), and not harmful to be eaten.

A generator integrated monitor sensor for animal ecosystem investigation, and an environmental sensor used for agricultural and environmental measurement, will be mentioned as Application Example 5 of the present disclosure. Compared to Application Examples 1 to 4, the number of installation of the sensors is significantly large and there are many cases where they are not intended to be recovered. Ability to work under a wide range of temperature of about −60° C. to 60° C. and high humidity; waterproofness and acid resistance against rain and water; and measures against ultraviolet radiation may be necessary. A side of high temperature is not at very high temperature. However, in comparison to Application Examples 1 to 4, durability for the outdoor use is demanded, and the device itself is demanded to be a material with less environmental burden.

In addition, as an environment pertinent to power generation, there is no extremely large acceleration, and the acceleration is 3 G or less. The vibration frequency is also small and is 1 kHz or less. As a generator, vibration power generation from actions of animals, vibration power generation using the pressure difference in wind, water and the like, thermal power generation using the temperature difference and temperature variation, solar power generation, power generation using the ion concentration difference between trees and soil, radio wave power generation, and the like, can be mentioned. From such environment and the generator, the material A which was of low frequency and low acceleration shown in Application Example 1 may be utilized. From the viewpoint of weather resistance and demand of biodegradability, a material including a polylactic acid resin derived from starch as the main component may be utilized. In such a manner, it is able to obtain advantages in terms of cost for achieving the same performance as in the case where a material of the past is used.

The present disclosure is not limited only to each of the above-mentioned embodiments and may be modified without departing from the gist of the present disclosure. For example, although generators having a cylindrical shape were mainly described in these embodiments, the present disclosure can be applied to generators having a spherical shape or other shapes as well. In such cases, in the generator having a spherical shape, in particular, the sliding part as in FIGS. 12A to 15B described above can be employed.

The present disclosure can take the following configurations.

(1) A generator, including:
a sliding member made of a biomass-containing material;
a first power generation element configured to slide with respect to the sliding member; and
a second power generation element configured to generate electrical power by variation of its relative position with respect to the first power generation element.

(2) The generator according to (1), in which
the second power generation element is configured to slide with respect to the sliding member.

(3) The generator according to (1) or (2), in which
the biomass-containing material includes a mixed resin of polymethyl methacrylate and polylactic acid.

(4) The generator according to any one of (1) to (3), in which
the biomass-containing material includes a polyamide resin derived from castor oil.

(5) The generator according to any one of (1) to (4), in which
the biomass-containing material includes a polylactic acid resin derived from starch.

(6) The generator according to any one of (1) to (5), in which
the first power generation element is a magnet; and
the second power generation element is a coil.

(7) The generator according to any one of (1) to (5), in which
the first power generation element is a dielectric substance including an electret; and
the second power generation element is an inductive circuit.

(8) The generator according to any one of (1) to (5), in which
the first power generation element is a piezoelectric element; and
the second power generation element is a structure body configured to add stress to the piezoelectric element.

(9) The generator according to any one of (1) to (5), in which
the first power generation element is an inverse magnetostrictive element; and
the second power generation element is a structure body configured to add stress to the inverse magnetostrictive element.

(10) The generator according to any one of (1) to (9), further including:
a casing made of a biomass-containing material, which is configured to accommodate the sliding member, the first power generation element and the second power generation element; and
a fixing member made of a biomass-containing material, which is configured to fix the sliding member to the casing.

(11) The generator according to any one of (1) to (10), in which
the first power generation element is a rotating body configured to slide with respect to the sliding member; and
the second power generation element is a structure body provided around the rotating body.

(12) The generator according to (11), in which
the rotating body is made of a biomass-containing material.

The present disclosure contains subject matter related to that disclosed in Japanese Priority Patent Application JP 2012-167649 filed in the Japan Patent Office on Jul. 27, 2012, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A generator, comprising:
a sliding member having a cylindrical shape and made of a biomass-containing material;
a first power generation element configured to slide across an interior surface of the sliding member;
a second power generation element configured to generate electrical power in accordance with a variation of a relative position of the second power generation element with respect to the first power generation element, wherein at least a portion of the sliding member is located within the second power generation element;

a casing made of a biomass-containing material, wherein the casing is configured to accommodate the sliding member, the first power generation element and the second power generation element;

a fixing member made of an elastic material, wherein the fixing member contacts an inner surface of the casing and is configured to fix the second power generation element to the sliding member and to fix the sliding member to the casing via the elasticity of the fixing member; and a circuit board electrically coupled to the second power generation element.

2. The generator according to claim 1, wherein the biomass-containing material includes a mixed resin of polymethyl methacrylate and polylactic acid.

3. The generator according to claim 1, wherein the biomass-containing material includes a polyamide resin derived from castor oil.

4. The generator according to claim 1, wherein the biomass-containing material includes a polylactic acid resin derived from starch.

5. The generator according to claim 1, wherein
the first power generation element is a magnet; and
the second power generation element is a coil wound around an outside of the sliding member.

6. The generator according to claim 1, wherein
the first power generation element is a dielectric substance including an electret; and
the second power generation element is an inductive circuit.

7. A generator, comprising:
a sliding member having a double cylinder shape with an inner peripheral space and an outer peripheral space, wherein the sliding member is made of a biomass-containing material;

a first power generation element located in the outer peripheral space of the sliding member, wherein the first power generation element is not fixed to the sliding member and is configured to slide inside the sliding member while in contact with the sliding member; and a second power generation element located in the inner peripheral space of the sliding member, wherein the second power generation element is not fixed to the sliding member and is configured to slide inside the sliding member and generate electrical power in accordance with a variation of a relative position of the second power generation element with respect to the first power generation element.

8. The generator according to claim 7, wherein the biomass-containing material includes a mixed resin of polymethyl methacrylate and polylactic acid.

9. The generator according to claim 7, wherein the biomass-containing material includes a polyamide resin derived from castor oil.

10. The generator according to claim 7, wherein the biomass-containing material includes a polylactic acid resin derived from starch.

11. The generator according to claim 7, wherein
the first power generation element is a magnet; and
the second power generation element is a coil.

12. The generator according to claim 7, wherein
the first power generation element is a dielectric substance including an electret; and
the second power generation element is an inductive circuit.

* * * * *